(12) United States Patent
Fermann

(10) Patent No.: US 6,700,709 B1
(45) Date of Patent: Mar. 2, 2004

(54) CONFIGURATION OF AND METHOD FOR OPTICAL BEAM SHAPING OF DIODE LASER BARS

(75) Inventor: Martin E. Fermann, Franklin, MA (US)

(73) Assignee: Boston Laser Inc., Norwood, MA (US)

( * ) Notice: Subject to any disclaimer, the term of this patent is extended or adjusted under 35 U.S.C. 154(b) by 19 days.

(21) Appl. No.: 10/085,620

(22) Filed: Mar. 1, 2002

(51) Int. Cl.[7] .............................................. G02B 27/30
(52) U.S. Cl. ....................................................... 359/641
(58) Field of Search .............................. 359/618, 641; 385/33, 37; 372/50

(56) References Cited

U.S. PATENT DOCUMENTS

| | | | |
|---|---|---|---|
| 4,884,281 A | * 11/1989 | Hawthorn et al. | 372/75 |
| 5,076,672 A | * 12/1991 | Tsuda et al. | 359/244 |
| 5,168,401 A | 12/1992 | Endriz | 359/625 |
| 5,243,619 A | 9/1993 | Albers et al. | 372/97 |
| 5,418,880 A | 5/1995 | Lewis et al. | 385/173 |
| 5,825,551 A | 10/1998 | Clarkson et al. | 359/629 |
| 5,852,699 A | 12/1998 | Lissotschenko et al. | 385/115 |
| 5,887,096 A | 3/1999 | Du et al. | 385/39 |
| 5,909,529 A | 6/1999 | Bhagavatula | 385/147 |
| 6,044,069 A | 3/2000 | Wan | 370/311 |
| 6,151,168 A | 11/2000 | Goering et al. | 359/618 |
| 6,212,011 B1 | 4/2001 | Lissotschenko et al. | 359/623 |
| 6,529,542 B1 | * 3/2003 | Karlsen et al. | 372/108 |
| 2002/0015558 A1 | 2/2002 | Lissotschenko et al. | 385/34 |

FOREIGN PATENT DOCUMENTS

| | | |
|---|---|---|
| DE | 199 20 293 | 5/2000 |
| JP | 2000-137139 | 5/2000 |

* cited by examiner

Primary Examiner—Ricky Mack
(74) Attorney, Agent, or Firm—Fulbright & Jaworski L.L.P.

(57) ABSTRACT

An optical beam shaping element is used to produce a beam of high brightness from a diode bar or a single emitter diode, allowing for efficient coupling of the beam into an optical fiber. An embodiment of the beam shaping element allows the construction of a quasi-monolithic or truly monolithic beam shaper incorporating both fast axis collimation as well as beam rotation. Additional slow axis collimation or collimation of the beam-rotated fast axes of the individual emitting elements of the diode bar is also possible in one quasi-monolithic or truly monolithic design. The beam rotation element comprises an array of beam-inverting planar grin lenses aligned with their axes of equal refractive index at an angle of ±45° with respect to the slow axes of the emitters. Alterative embodiments comprise beam rotation elements based on two planar grin lens arrays, arrays of uniaxial grin lenses, arrays of uniaxial focusing reflective optic or arrays of cylindrical Fresnel lenses. The beam shaping element can be used in conjunction with stacks of diode bars or alternatively optical beams of ultra-high power can be generated by combining multiple fiber coupled diode bars in a fiber bundle incorporating metallization and a heat sink.

23 Claims, 10 Drawing Sheets

CONFIGURATION OF AND METHOD FOR OPTICAL BEAM SHAPING OF DIODE LASER BARS

FIELD OF THE INVENTION

This invention relates to diode lasers and more particularly, a configuration of and a method for optical beam shaping of diode laser bars to produce an optical beam of high power and brightness, allowing for efficient coupling of the optical diode laser bar output into an optical fiber.

DESCRIPTION OF THE PRIOR ART

High power solid state lasers and particularly high power fiber lasers generally depend on the availability of optical pump beams with high optical power and brightness, i.e., the required pump power needs to be made available in as small a space as possible. Semiconductor diode laser arrays are firmly established as the main source of optical beams of high power, i.e., 1 watt and above including ultra-high powers of greater than 10 watts. With current semiconductor technology, a power approaching 40 kW can be produced by a stacked diode array with dimensions of only 5×10 cm (R. J. Beach et al., Laser Focus World, December 2001). The stacked diode array typically consists of individual diode bars of around 1 cm in length, which in turn incorporate 10–20 individual emitters separated by 0.2–1.0 mm. The laser beam originating from one individual emitter typically has a divergence of 10°×50°. The small divergence beam is in the plane of the x axis and the high divergence beam is in the plane of the y axis. As shown in FIG. 1, a laser diode 101 emits laser beam 102 having relatively small divergence in the direction of the x axis but high divergence in the direction of the y axis. These axes are sometimes referred to as slow and fast axis respectively. The fast axis beam is generally diffraction limited and can be collimated with a cylindrical lens aligned parallel to the slow axis of the single emitter, i.e., laser diode 101. The slow axis beam is typically far from diffraction limited.

The brightness B of the optical beam from an individual emitter can be calculated as B=power/(emitting area× angular divergence). For an individual emitter of dimensions 1×100 μm operating at a power of 2 W we obtain B=14 MW/cm$^2$. In contrast, the brightness of a 20 element diode bar with dimensions 1 μm×1 cm operating at a power level of 40 W is only about 3 MW/cm$^2$, whereas the brightness of a diode stack as described above operating at a power of 40 kW is only of the order of 5 kW/cm$^2$. Indeed, the stringent requirements for cooling of a diode stack require that the individual diode bars and emitter areas are substantially spaced apart, greatly increasing the emitter area and limiting the brightness of such high-power laser systems.

The brightness of diode laser beams has traditionally been increased by the implementation of beam-shaping optics, i.e., by optically combining the individual emitter beams from the diode array to generate a single optical beam which can be efficiently coupled into an optical fiber (See, e.g., U.S. Pat. No. 5,168,401 of Endriz, hereinafter Endriz '401). The brightness B of the fiber-coupled optical beam can be calculated as B≈P/(A*πNA$^2$), where P is the coupled power, A is the core area and NA is the numerical aperture of the fiber.

Optical beam shaping is possible by a variety of means. As shown in FIG. 2, most beam-shaping methods transform the optical beams such that the beams from the individual emitters 201, 202 and 203 form a picket fence 209, 210, 211 with the fast axis beams aligned parallel to each other. Since the beams 204, 205 and 206 are diffraction limited along the fast axis (ie., in the y direction as depicted), very tight packing of the emitters along the fast axis is possible. To facilitate optical beam transformation, collimation of the fast axis beam is also implemented with a cylindrical lens 207 as shown in FIG. 2 followed by beam shaping optics 208. The generation of a properly aligned picket fence comprising collimated beams 209, 210 and 211 is key to most industrially relevant beam shaping methods. We can distinguish four different classes of picket fence generation methods and systems.

A first class of methods generates the picket fence by optical rotation of each emitter beam by 90°, where the direction of the emitter beam is further deflected by around 90° after reflection from at least two reflecting surfaces. The Endriz '401 patent describes such an example. Further examples of such a method are U.S. Pat. No. 5,418,880 of Lewis et al. and U.S. Pat. No. 6,044,096 of Wolak, et al.

A second class of methods generates a picket fence by optical beam rotation based on beam-rotating prisms such as the Abbe-König prism as disclosed in U.S. Pat. No. 5,243, 619 of Albers, et al. The advantage of this design is that it avoids a 90° deflection of the beam direction such that only a small displacement in the propagation direction results.

A third class of methods of generating a picket fence is based on beam deflection in a set of multi-facetted mirrors or prisms. In these methods a first multi-facetted optical structure deflects the beam to obtain some beam spacing in the y direction, while a second multi-facetted optical structure deflects the beams to overlay the beams along the x direction (see, e.g., U.S. Pat. No. 5,887,096 of Du et al. and U.S. Pat. No. 6,151,168 of Goering et al.). Such systems do not require beam rotation optics, but generally comprise a beam deflection along the propagation direction, relying on the manufacturing of expensive high precision multi-facet optics. The function of beam deflection and overlay can also be accomplished in one single optical element as disclosed by U.S. Pat. No. 5,825,551 of Neilson, et al. A limitation of the approach taken by Neilson et al. is the variation between the optical path lengths of each individual emitter beam through the beam shaping optic, which in-turn limits the focussability of the resulting beam. Note that the first three classes of beam-shaping optics use non-focussing optics.

A fourth class of methods of generating a picket fence is based on beam rotation in a transmissive optical element that comprises at least one cylindrical surface. (See, e.g., Lissotschenko et al., German Patent No. DE 19920293.) A representation of this structure is shown in FIG. 3. As shown therein, optical element 301 comprises an array of cylindrical lenses 302, 303, 304 and 305. The arrangement provides for a 90° rotation of respective laser beans such that a laser beam depicted as rays 306a, 306b and 306c undergoes to 90° rotation in a plane perpendicular to its direction of transmission along the Z axis as it transits cylindrical lens 303. Similarly, rotated in the x,y plane are laser beans 307a, 307b, 307c and 308a, 308b, 308c by the respective cylindrical lenses 304 and 305. Recently, the technique by Lissotschenko et al. was extended (see U.S. Patent Application Publication No. US2002/0015558) to include also beam rotation cylindrical lenses with an additional concave curvature, where the central axis of the concave surface is orthogonal to the main cylinder axis. Such a cylindrical lens was referred to as a concave toroidal surface. A limitation with these techniques is that generally cylindrical lens arrays need to be manufactured for beam shaping of a whole diode bar, which are difficult to coat with anti-reflection coating due to the presence of large curvatures and multiple crevices in the optics. Moreover, another limitation with the technique by Lissotschenko et al. is that no beam homogenization elements are used. Without beam homogenization tight packing of individual beamlets from a diode bar along the fast axis is limited and therefore a significant reduction in brightness results.

Generally all techniques described so far are not monolithic and therefore complex alignment procedures are required, leading to high manufacturing costs. Moreover, the application of optical coating is also difficult in these devices which can limit the optical throughput.

SUMMARY OF THE INVENTION

The present invention is directed to an optical arrangement allowing efficient coupling of a diode bar into an optical fiber. The brightness of the beam emitted from the diode bar is maximized by incorporating a beam inversion optic with a magnification M of M=−1. The beam inversion optic is based on arrays of graded index (grin) optic, cylindrical Fresnel lenses, reflective focusing optics or a more general optical system. The graded index optic can be planar, circularly symmetric, circularly symmetric with arbitrarily shaped input and output surfaces and can comprise more general beam inversion designs. The reflective focusing optics can conveniently comprise cylindrical reflective mirrors. For the case of a planar graded index optic, beam inversion is obtained by aligning the lines of equal refractive index at an angle of approximately ±45° (as used herein, the "±" sign refers to an angular displacement of the specified amount in both positive and negative rotational directions and not to a range of angular displacements) with respect to the slow axis of the individual emitters. In the case of cylindrical Fresnel lenses, the lines of equal phase retardation are equally aligned at an angle of approximately ±45° with respect to the slow axis of the individual emitters. In the case of circularly symmetric graded index lenses, the lens axis is aligned at an angle of approximately ±45° with respect to the slow axis of the individual emitters. Equally, more generally a shaped beam inversion optic has at least one of the optic axes aligned at an angle of approximately ±45° with respect to the slow axis of the individual emitters. Beam inversion is further facilitated by first collimating the fast axis of the individual emitters with a single cylindrical lens aligned parallel to the slow axis of the diode bar. Additional collimation of the slow axis beam can also be implemented. Multi-faceted lenses can further be used for beam homogenization. Highly integrated monolithic beam inversion optical systems are also possible. The monolithic beam inversion optical system comprises an integrated fast axis collimation element in conjunction with a beam rotation element. An additional slow axis collimating element can also be incorporated in a monolithic fashion; a monolithic construction is further also possible with an additional multi-facet beam homogenizing element, collimating the fast axes of the individual beam rotated beamlets. The beam inversion optic can further be used for beam shaping of the output of individual emitters, facilitating efficient coupling of the output into optical fibers. Ultra-high power optical beams can be obtained by implementing the beam-inverting optic with stacks of diode bars. Alternatively, ultra-high power optical beams can be obtained by combining the output of individual fiber-coupled diode bars into an optical fiber bundle that is operated in conjunction with an efficient heat sink.

DESCRIPTION OF THE PREFERRED EMBODIMENT

Figure 1:
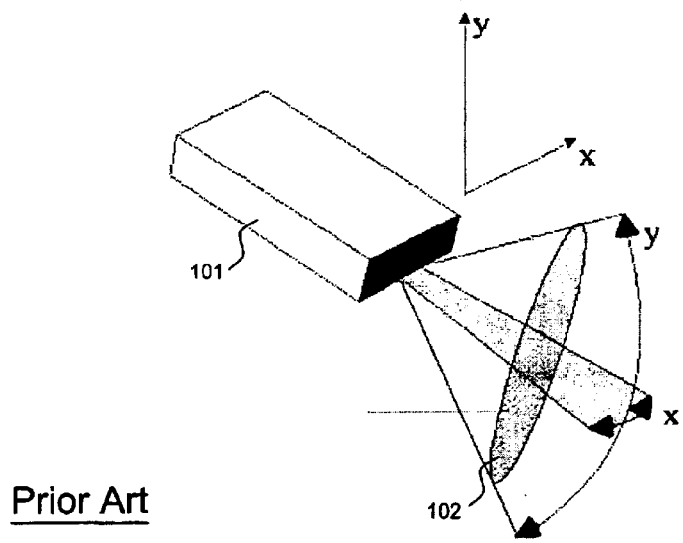
FIG. 1 is a diagram of the light emission from a single emitter element of a typical diode bar.
Figure 2:
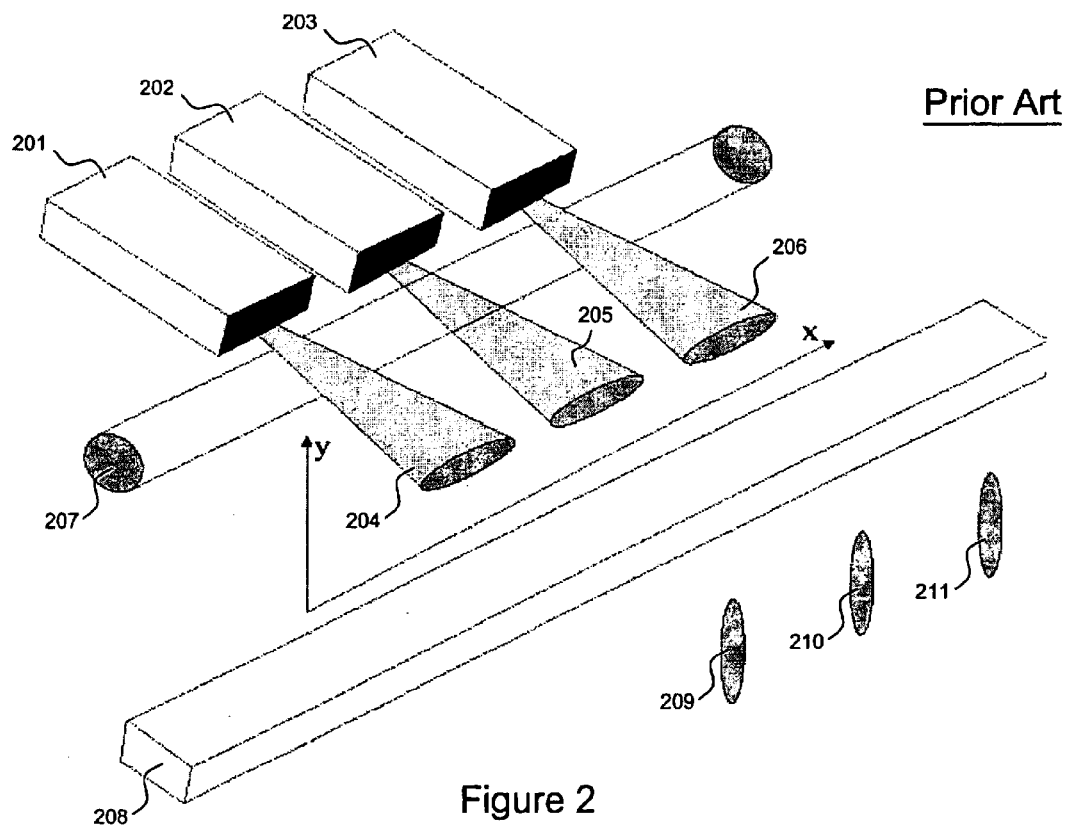
FIG. 2 is a diagram of the principle of beam-shaping of the output of a diode bar.
Figure 3:
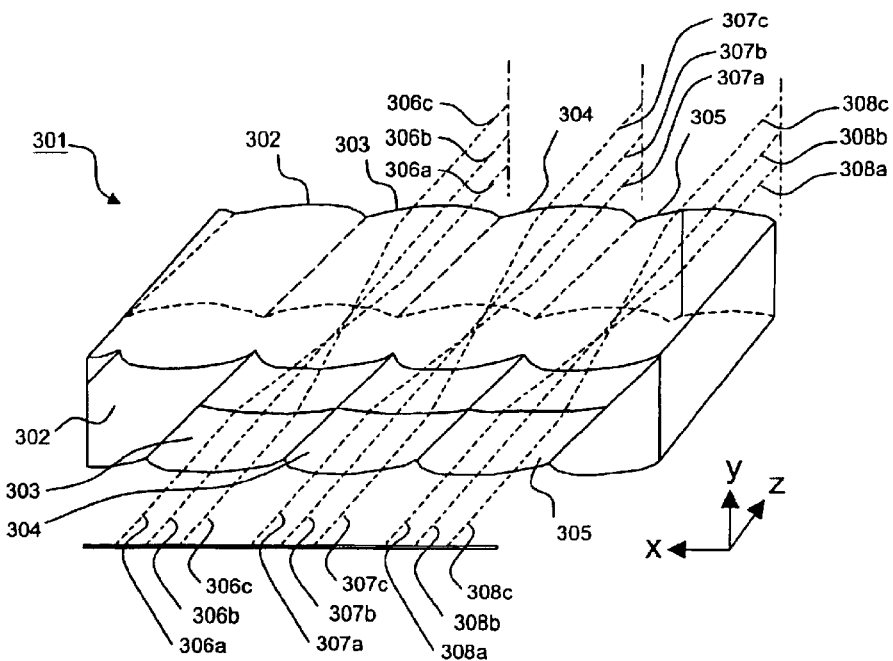
FIG. 3 is a diagram of a prior art beam-shaping apparatus.
Figure 4A:
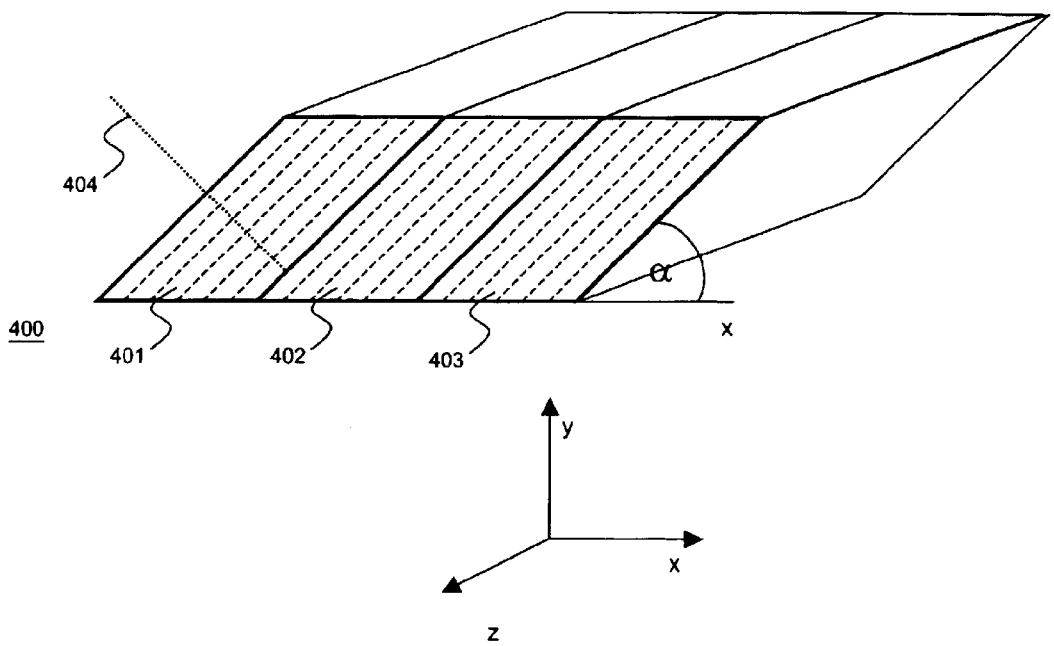
FIG. 4A is a diagram of an array of planar grin lenses.

FIG. 4A represents an array of planar grin lenses according to an exemplary embodiment of the present invention. The planar grin lens array 400 comprises three planar grin lenses 401, 402, 403. Three grin lenses are shown only for simplicity; a beam-shaping grin lens array would typically comprise 10–20 grin lenses. The planar grin lenses comprise lines of equal refractive index (the dashed lines in FIG. 4A), which are aligned at an angle α of approximately 45° with respect to the x-axis. Alternatively, an angle of −45° can be chosen. The refractive index along a line 404 perpendicular to the lines of equal refractive index typically has a near parabolic profile, where the highest refractive index is obtained in the center of the planar grin lens. The refractive index along the z axis (the beam propagation axis) is approximately constant.

Figure 4B:
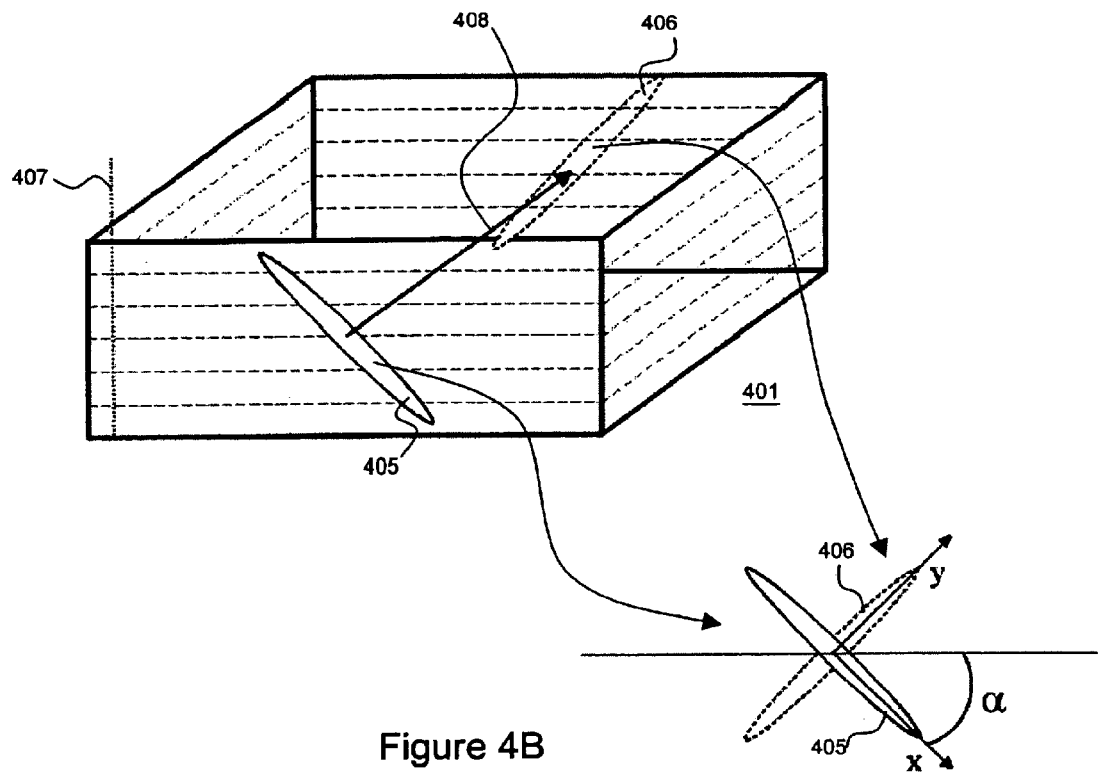
FIG. 4B is a diagram of the operation of a single beam-shaping planar grin lens according to an embodiment of the present invention.

The operation of the grins lens array as a beam rotator for the beam emitted from a diode bar is explained with reference to FIG. 4B. It is assumed that the fast axis of the diode bar is collimated and that an elliptical near collimated beamlet 405 aligned parallel to the x axis is emitted. For simplicity only one planar grin lens segment 401 is drawn, where the planes of equal refractive index are arranged horizontally in FIG. 4B. For additional orientation the line 407 (corresponding to line 404 of FIG. 4A), perpendicular to the planes of equal refractive index is further drawn in FIG. 4B as well as a coordinate system. The beamlet 405 is propagating along the Z direction in the direction of arrow 408 through planar grin lens 401. At the other end of the planar grin lens a beamlet 406 is obtained. Because the beamlet is aligned at an angle of 45° with respect to the planes of equal refractive index, the optical system can be classified as being non-orthogonal. However, assuming the planar grin lens is near isotropic, we can use scalar beam propagation and we can thus, to a first order of approximation, transfer the imaging rules of standard orthogonal grin lens systems to the present system. It thus follows that for a planar grin lens with a pitch=0.5, a magnification of M=−1 is obtained. A magnification of M=−1 entails beam inversion, i.e., the output beam is obtained from the input beam via a reflection along the planes of equal refractive index as can be seen from FIG. 4B. With respect to the slow axis of the laser facet (parallel to the x axis), it appears that the beamlet is rotated by an angle of 90° to result in a beamlet 406 orthogonal to the slow axis. It can further be verified that an optical beam inversion system with a magnification M≠−1 does not produce an apparent beam rotation by 90°. For example for a magnification M=−2, an apparent beam rotation of approximately 108° is obtained. An optimum beamlet is obtained when the fast axis collimation lens is chosen to produce a beam with a divergence of $D_s/N$ in the fast axis, where $D_s$ is the divergence in the slow axis and N is the number of emitters. The divergence in the fast axis can be controlled by controlling the diameter of the first cylindrical collimating lens. Planar grin lenses can for example be manufactured by ion exchange in planar optical substrates. (See, for example, U.S. Pat. No. 5,909,529 to Bhagavatula.) To assemble an array, the substrates need to be cut appropriately and aligned and bonded on top of each other.

Figure 5:
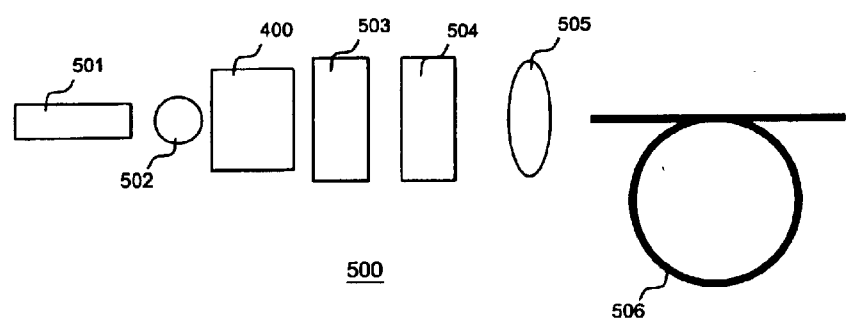
FIG. 5 is a diagram of an optical design allowing coupling of a diode bar output into an optical fiber according to an embodiment of the present invention.

Referring to FIG. 5, an optical arrangement 500 using a beam inverter for coupling an output from a diode array into an optical fiber is illustrated. Diode bar 501 is collimated along the fast axis by cylindrical collimation lens 502. The individual beamlets are rotated by 90° by the beam inverting element 400. An additional set of cylindrical and/or spherical lenses 503, 504, 505 (more than three lenses may be used) is then used to couple the diode beam into optical fiber 506. An additional conventional multi-facet cylindrical lens (not shown) can further be implemented between the beam rotation element 400 and a fast axis collimation lens comprising lens 502 Such a multi-facet cylindrical lens collimates the slow axis of the individual emitters and is useful if the acceptance angle of the beam-rotation optic for proper operation is limited. Alternatively, to avoid the use of a multi-facet cylindrical lens before beam rotation, two closely spaced planar grin lens arrays with a pitch smaller than 0.25 (the lines of equal refractive index being parallel in the two grin lens arrays) can be used successively one after another to increase the acceptance angle of the beam rotation optic. Such an implementation is not separately shown.

Figure 6:
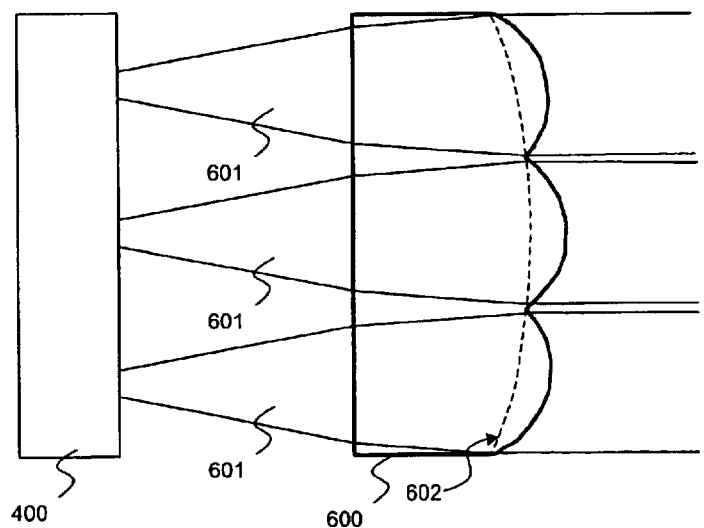
FIG. 6 is a diagram of a beam homogenizing multi-facet lens for optimum coupling of a beam-shaped diode bar into an optical fiber.

As shown in FIG. 6, efficient coupling can further be obtained when implementing a multi-facet beam homogenizing lens 600 at a point after beam rotation element 400 at a location where the width of the beamlets 601 along the fast axis is large enough to be touching each other. One way to provide optimum coupling of the beam shaped output of a diode bar into an optical fiber requires a beam with both equal width and divergence before coupling into the actual fiber. To further facilitate coupling into an optical fiber the cylindrical facet elements collimating the fast axes of the beamlets can be designed to be lying on an additional virtual curved surface (indicated by the dotted line 602 in FIG. 6). Equally, an optimum lens curvature for recollimation of the slow axis can be designed for multi-facet lens 600.

Figure 7A:
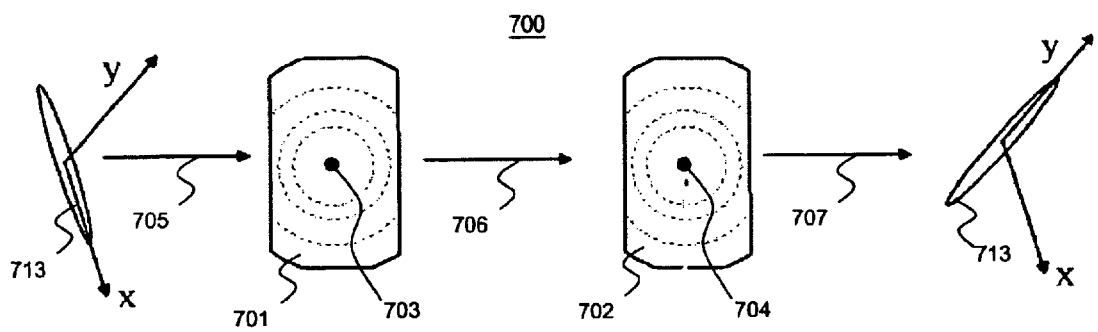
FIGS. 7A, 7B, and 7C are diagrams of an alternative embodiment for beam shaping optics based on flat surfaced uni-axial grin lenses.
Figure 7B:
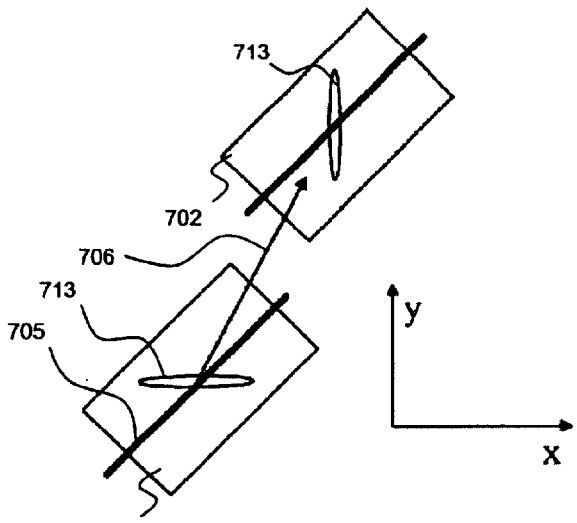
Figure 7C:
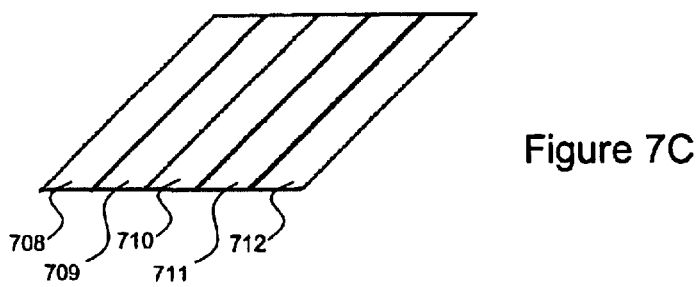

Whereas the embodiment described above includes planar grin lens arrays as elements to achieve optical beam rotation, a more general beam-inverting optic with a magnification of −1 can be used instead. FIGS. 7A–7C depict a beam rotation element 700 comprised of two conventional grin lenses 701, 702 with a centro-symmetric refractive index profile, where the entrance and exit sides have been "shaved off", i.e., flattened. A side view down the central axis of grin lenses 701, 702 is shown in FIG. 7A. Here the dashed lines indicate lines of equal refractive index. The central axis 703 and 704 is indicated with the dark spot in the middle of respective grin lenses 701 and 702; the optical beam path is indicated with arrows 705, 706, and 707. Both the entrance and exit surfaces of the grin lenses are flattened; however, an imaging function is nevertheless obtained because of the graded refractive index profile inside the lenses. Optimum entrance and exit surfaces as well as an optimum lens separation can be calculated with a conventional ray-tracing program.

FIG. 7B is a top view of the same optical arrangement looking along the propagation direction 706 of a beamlet 713 as emitted from a diode bar. Note that the central axis 705 is aligned at an angle of ±45° with respect to the orientation of the slow axis of the diode bar (not shown). FIG. 7C depicts the construction of a beam shaping lens array, in where the individual grin lenses 708–712 are attached next to each other. To facilitate attachment of the grin lenses, the surfaces of the grin lenses parallel to the beam direction can be flattened as indicated in FIG. 7A. A complete fiber coupling arrangement using this system can be obtained as shown in FIG. 5, where element 400 may be replaced with the grin lens arrangement 700 depicted in FIG. 7.

Figure 8:
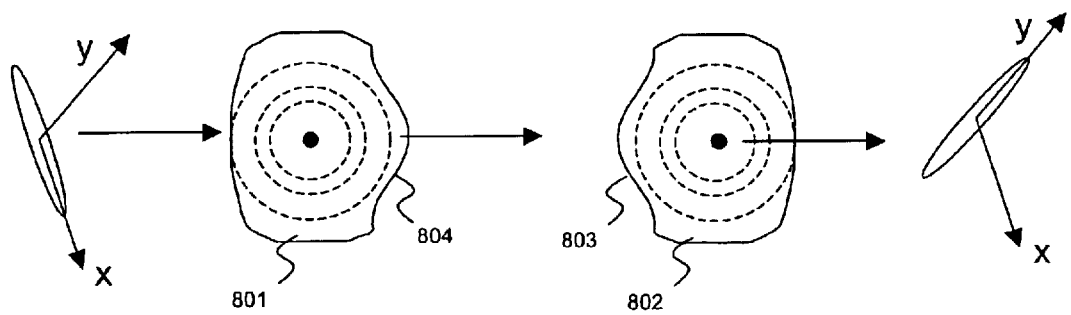
FIG. 8 is a diagram of an alternative embodiment for beam shaping optics based on uni-axial grin lenses with arbitrarily shaped input and output surfaces.

An alternative embodiment to the grin-lens beam inversion system displayed in FIG. 7 is shown in FIG. 8. Here again a set of two centro-symmetric grin lenses 801 and 802 is used that provide an overall magnification of M=−1. Here, an example with aspheric entrance and exit surfaces 803 and 804, respectively, is shown. Again the central axis of the grin lenses should be aligned at an angle of ±45° with respect to the slow axis of a respective emitter. Additional spacers can be implemented between the grin lenses to ensure an optimum grin lens separation is obtained in production.

Figure 9:
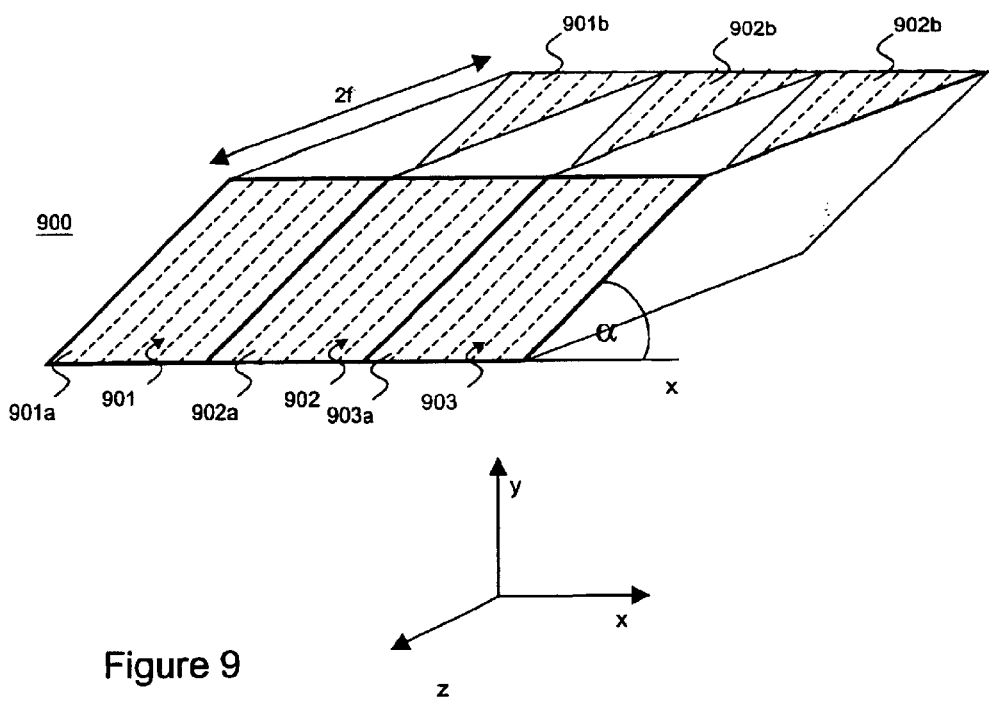
FIG. 9 is a diagram of an array of beam-shaping cylindrical Fresnel lenses according to an embodiment of the present invention.

Yet another alternative embodiment of a beam inversion system is shown in FIG. 9. The system is very similar to that described with respect to FIG. 4, however the planar grin lenses are substituted with cylindrical Fresnel lens arrays 901, 902, and 903 as shown in FIG. 9. Fresnel lenses are well known in the state of the art and are not further explained here. For each emitting area, two cylindrical Fresnel lenses (e.g., 901*a* and 901*b*) need to be used for beam inversion. The pair can be fabricated directly on the front and exit surfaces of a parallelepiped. To obtain optimum beam inversion the distance between the Fresnel lenses 901*a,* 902*a,* 903*a* and 901*b,* 902*b,* 903*b,* respectively, needs to be 2×f, where f is the focal length of one Fresnel lens. Moreover, the lines of phase reversal (or equal phase retardation) need to be aligned at an angle ∝ of 45° with respect to the slow axis of the diode emitter. The lines of phase reversal (or equal phase-retardation) are indicated by the dashed lines in FIG. 9. In case of a limited acceptance angle of the cylindrical Fresnel lens, collimation of the slow axis of an individual emitter can be implemented before the Fresnel lens.

Figure 10A:
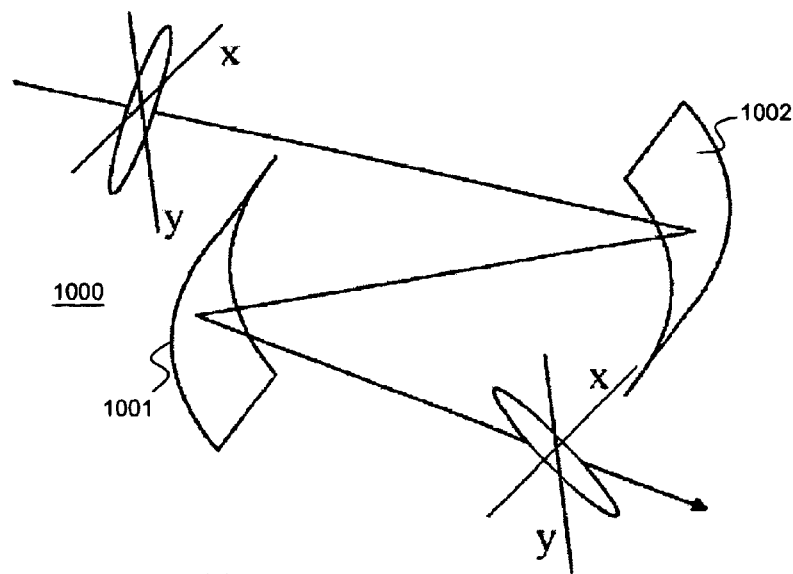
FIG. 10 is a diagram of a reflective focusing optical element for beam shaping according to an embodiment of the present invention.
Figure 10B:
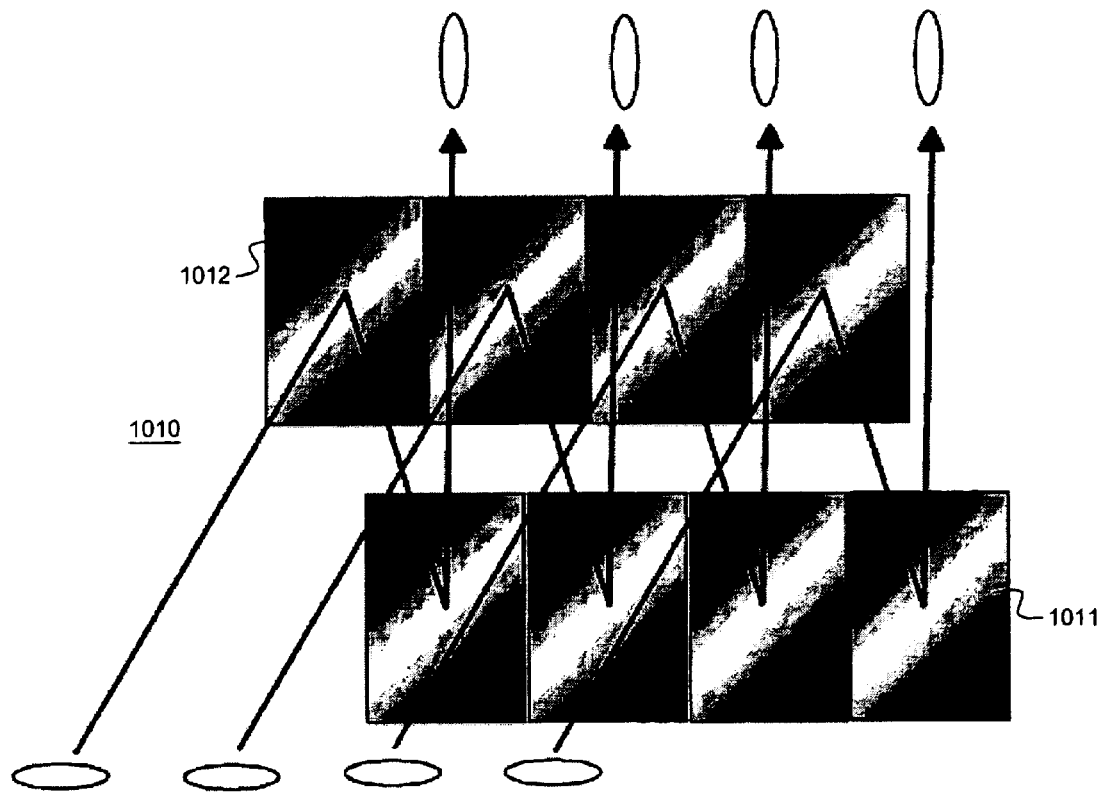

Whereas the embodiments described so far comprised transmissive optics, reflective optics can also be used for beam shaping. Such an embodiment is depicted in FIGS. 10A and 10B. A beam rotator 1001 for a single emitter is shown as well as a reflective optic array 1010, comprising two arrays of uni-axial reflective optical elements 1011 and 1012 for beam shaping of a diode bar. Here it is assumed that the cylinder axes of the cylindrical elements in the form of mirrors 1001, 1002 are aligned parallel to the x axis, whereas the beamlet emerging from the diode bar is aligned at an angle of 45° with respect to the x-axis. The separation between cylindrical mirrors 1001 and 1002 corresponds to twice their focal lengths. Note that the cylinder surface curvature can be spherical, parabolic or aspheric. The beam path through a reflective beam shaping optic comprised of an array of reflective focusing elements is shown in FIG. 10B. Ideally, the beam from the diode bar passes over the first reflective array 1011 to be reflected by the second reflective array 1012; after reflection at the first reflective array 1011, the beam-shaped output passes under the second reflective array 1012.

Figure 11:
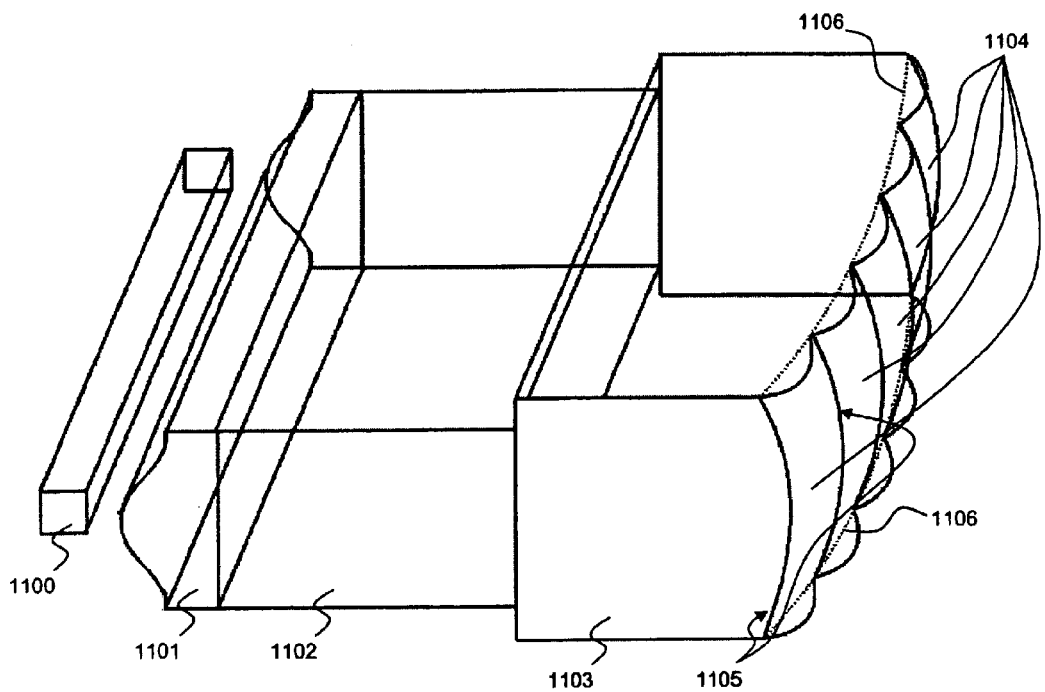
FIG. 11 is a diagram of an integrated beam shaping optical element, comprising fast axis collimation, beam rotation and beam homogenization according to an embodiment of the present invention.

In the construction of high-power diode systems with high brightness, cost is a critical factor. Therefore a high degree of integration is sought. Particularly the planar grin lens array described in FIG. 4 lends itself to such a high degree of integration. An example of an integrated fast axis collimation lens, a planar beam rotating element and a beam homogenizing element is shown in FIG. 11. Laser diode bar 1100 is first collimated along the fast axis by aspherical lens 1101. The aspherical lens can be glued or fused directly to the beam rotating planar grin lens array 1102. Equally, the beam homogenizing element 1103 can be glued, bonded or fused to the back end of the beam rotating planar grin lens array 1102 to form a quasi-monolithic single optical element. Alternatively, the aspherical fast axis collimating surface as well as the multiply curved beam homogenizing surface can be directly machined from the planar grin lens array to form a single monolithic element. (As used herein, the terms "quasi-monolithic" refers to optical elements formed separately and thereafter physically attached or joined such that an optical beam traversing the optical elements never is exposed to air; "monolithic" to one or more optical elements formed from or on a single block of substrate such as glass; and the phrase "at least quasi-monolithic" refers to both, i.e., quasi-monolithic and truly monolithic structures.) As yet another alternative, the fast axis collimating element can be constructed from another grin lens structure, such as a planar grin lens with its planes of equal refractive index aligned parallel to the plane comprising the slow axis of the diode bar and the beam propagation direction. Similarly, the beam homogenizing element can be constructed from another grin lens i.e., the multi-facet fast axis collimation surface could be replaced with a planar grin lens array with its lines of equal refractive index aligned orthogonal to the slow axis of the diode bar. Such an implementation is not separately shown.

The beam homogenizing element comprised of non-grin optics is similar in construction to the element 1103 described in FIG. 6. The multi-facet elements 1104 on the back-side of the beam homogenizing element 1103 are used for further collimation of the fast axis, whereas the orthogonal curved surface 1105 is used for further collimation of the slow axis. The multi-facet collimating surfaces 1104 can further be positioned on an additional curved surface (dashed lines 1106 of homogenizing element 1103) to optimize beam homogenization. An optimum performance is achieved when both the divergence and size in the x and y axes arc the same. Note that unequal beam sizes $s_x$, $s_y$ along the x and y axes respectively can also be tolerated. In this case it should hold for the ratio of the divergences $d_x/d_y$ along the x and y axis, $d_x/d_y=s_y/s_x$ to enable optimum focusing into an optical fiber with additional cylindrical lenses. Note that to save cost, the multi-facet structure on homogenizing element 1103 can be omitted and only a single cylindrical surface along the fast or slow axis can be implemented. For coupling the diode output into an optical fiber, an arrangement as described in FIG. 5 can be used, where elements 1101, 1102, 1103 directly replace elements 502, 400 as well as 503 in FIG. 5.

Figure 12:
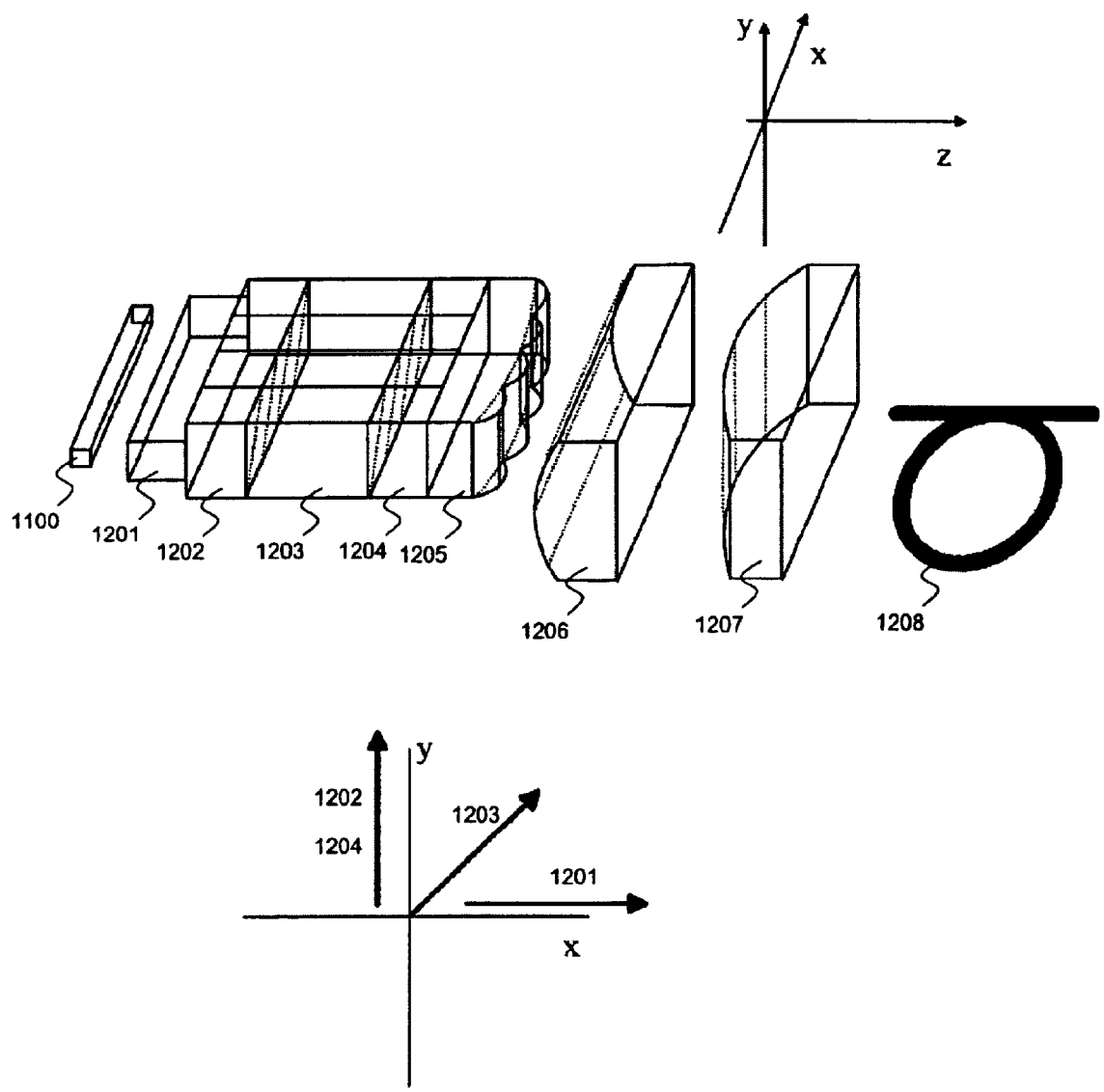
FIG. 12 is a diagram of an ultra-compact integrated beam shaping optical element as used in fiber coupling according to an embodiment of the present invention.

An example of an ultra-compact monolithic beam shaping optical element as used for optimum coupling of a diode bar 1100 into an optical fiber is shown in FIG. 12. The element comprises planar grin lens element 1201, three grin lens arrays 1202, 1203, 1204 a beam homogenizing element 1205, fiber coupling optics 1206, 1207 and a fiber 1208. It should be noted that completely integrated diode beam shaping and fiber coupling functions can be envisioned based entirely on grin lenses. However, the size of the grin lens fiber optics prohibits a practical implementation to date. For better orientation a coordinate system is drawn at the top of FIG. 12. The diode beam is assumed to propagate in the z direction with the slow axis aligned parallel to the x axis. The planes of equal refractive index in the grin lenses (or arrays) are displayed by arrows in the coordinate system shown at the bottom of FIG. 12. Here the individual arrows referring to individual grin lenses (or arrays) are parallel to the intersections of the individual planes of equal refractive index with the x-y plane. The first fast axis collimation grin lens 1201 has its planes of equal refractive index aligned parallel to the x axis. The second slow axis grin lens array 1202 has its planes of equal refractive index aligned parallel to the y axis. The slow axis grin lens array 1202 reduces the divergence along the x axis of each individual beamlet passing through the beam rotating grin lens array 1203. The beam rotating grin lens array 1203 has its planes of equal refractive index aligned at an angle of substantially 45° with respect to the x axis. Grin lens array 1204 has its planes of equal refractive index aligned parallel to the y axis. Grin lens array 1204 is provided to minimize the length of the optical arrangement in the z axis. Grin lens array 1204 comprises diverging grin lenses constructed with an inverse parabolic profile, i.e., the refractive index is lowest in the center of the lenses and increases towards the edge of the lenses. The diverging grin lens array increases the divergence along the fast axis of the beam-rotated beamlets. Hence the propagation length it takes for the beamlets to be touching each other along the beam-rotated fast axes is reduced. At the point where the beam rotated beamlets touch each other, beam homogenizing element 1205 is incorporated. The beam homogenizing element produces a single gap-free uniform beam along the x-axis. Two (or three) cylindrical lenses 1206, 1207 are then typically sufficient to obtain optimum coupling into the optical fiber 1208. Note that elements 1202, 1204 and 1205 can be eliminated to save cost. Equally, grin-lens array 1202 can be substituted with a single grin lens at the end of the monolithic element. Any omissions of optical elements can lead to a reduction in achievable fiber-coupled brightness, however.

Figure 13A:
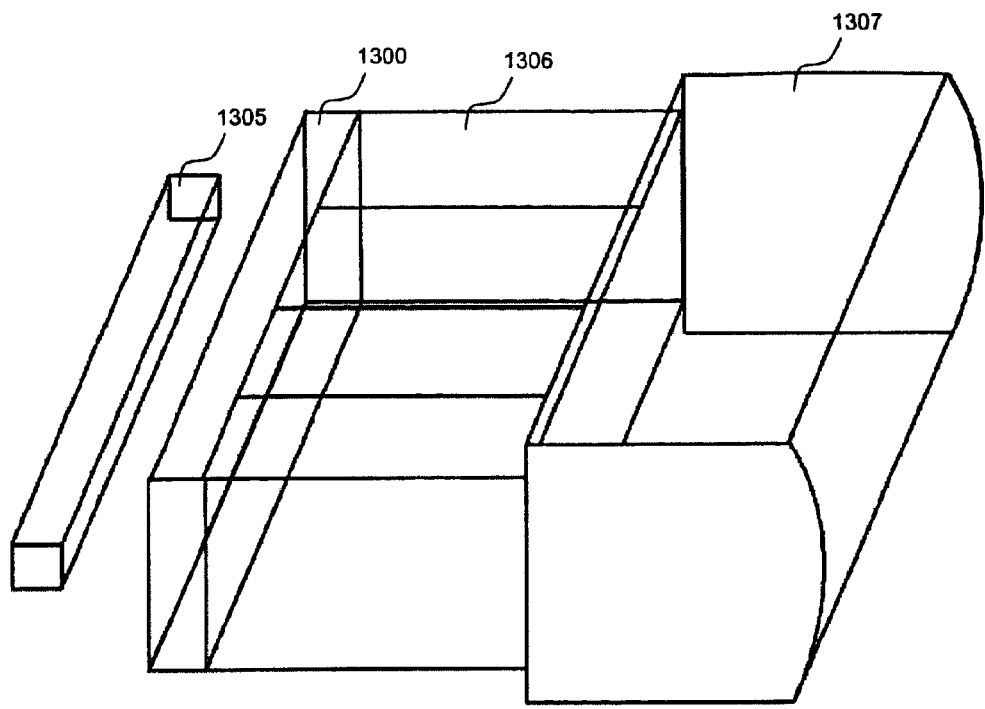
FIGS. 13A and 13B are diagrams of beam-shaping of a single-emitter diode laser according to an embodiment of the present invention.
Figure 13B:
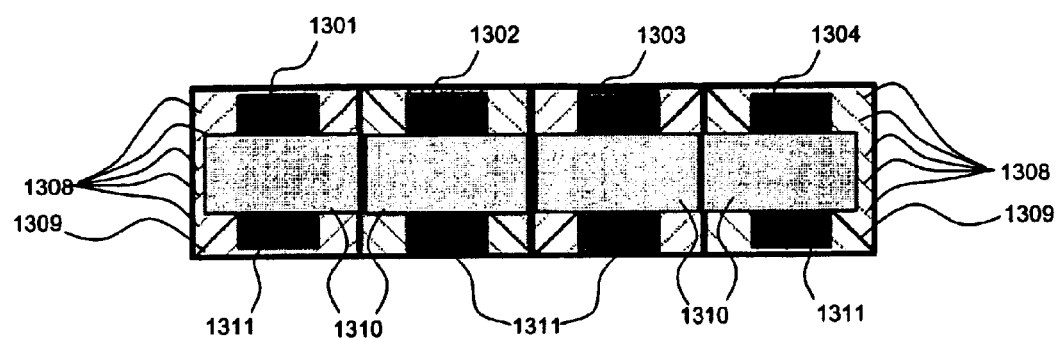

In yet another alternative embodiment the beam rotation elements described with respect to FIGS. 4, 7, 8, 9, 10, 11 and 12 can also be used to enable efficient coupling of a single emitter diode laser into an optical fiber. An example of such an arrangement is shown in FIG. 13. Here, for simplicity we demonstrate an implementation with the monolithic beam shaping element as described with reference to FIGS. 13A and 13B. We indicate a fast axis collimation element 1300 that comprises a planar grin lens with the planes of equal refractive index aligned parallel to the plane made up by the slow axis of the emitter and the propagation direction. A single-emitter diode laser element 1305 with a length of around 1×500 μm is optimal, though a slow axis as short as 100 μm and as long as 1 mm could also be used. A planar grin lens array 1306, comprising 4 individual planar grin lenses 1301, 1302, 1303, 1304 is used, where the planes of equal refractive index are aligned successively to be at an angle of ±45° with respect to the slow axis of the emitter. As a result the planes of equal refractive index of adjacent grin lenses are aligned orthogonally to each other. The lines of equal refractive index are dashed lines 1308 in elements 1301–1304, where the line of maximum refractive index in these lenses is indicated by the thick diagonal line 1309. The form of the laser emission after fast axis collimation by the lens 1300 is represented as the light gray shaded region 1310 in FIG. 13B. After beam rotation by element 1306, a beam pattern comprising 4 beamlets as represented by the dark shaded region 1311 of FIG. 13B is obtained. Lens element 1307 serves to collimate the slow axis of the rotated beamlets. Additional cylindrical and spherical optics can then be used to couple the beam into a fiber with a diameter of 100 μm with a NA<0.20. In alternative embodiments more than 4 or less than 4 individual beam-shaping elements in a beam shaper can be used.

Figure 14A:
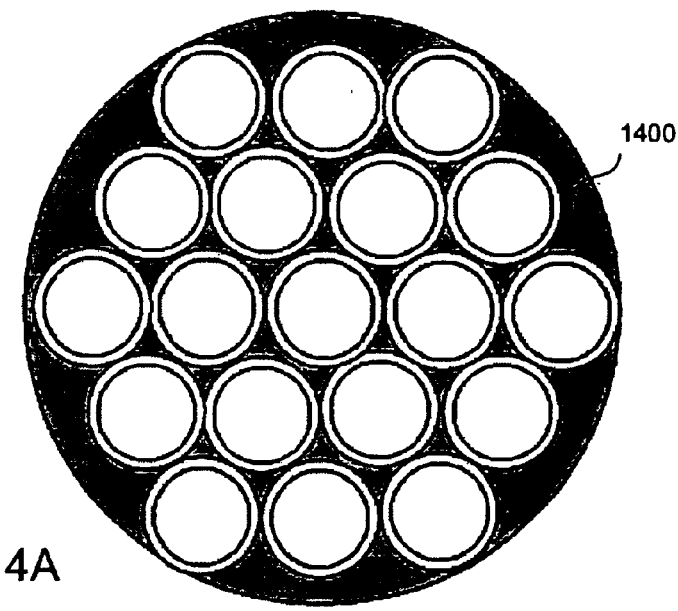
FIGS. 14A and 14B are diagrams of a fiber bundle combining the output of several diode bars into an ultra-high power optical beam according to an embodiment of the present invention.
Figure 14B:
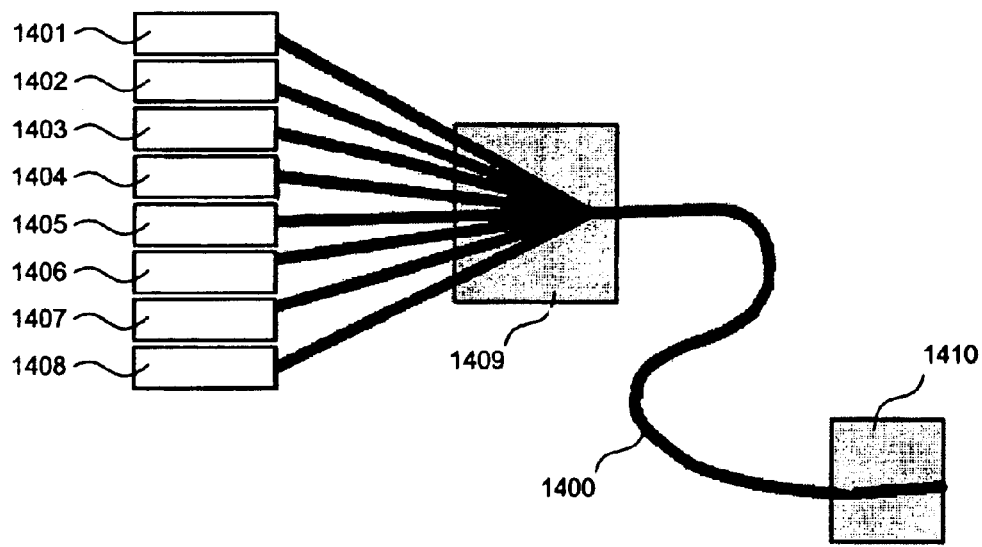

Though the systems described above are intended for use with diode bars, the beam shaping methods can be extended to the beam shaping of diode stacks, i.e., the monolithic beam shaping element as described in FIGS. 11 and 12 can be stacked in the vertical direction with lens elements such as lens element 1103 sitting directly on top of each other, which in turn determines the minimum bar spacing in the diode stack. Such an implementation is not separately shown. Stacking in the horizontal direction is also possible. To avoid the use of diode stacks, individual fiber coupled diode bars can be combined in fiber bundles to provide optical beams with ultra-high powers. Such an embodiment is shown in FIGS. 14A and 14B. To avoid damage of the fiber bundle 1400, each fiber should be metal coated. The individual fibers can then be fused together and can be attached to additional heat sinks 1409 and 1410 to increase the damage threshold. Here a fiber bundle 1400 with 19 individual fibers is shown in FIG. 14A. A corresponding coupling arrangement with beam-shaped diode bars 1401–1408 (only 8 coupling arrangements are shown for simplicity) is shown in FIG. 14B. Assuming that each fiber contains 50 W of optical power, the generation of a high-power kW beam poses no problem. Further scaling to 10 s of kWs is possible by increasing the number of fibers. The diameter of the fiber bundle can farther be decreased by tapering the fibers to a smaller diameter prior to creating the bundle. Also the individual fibers can be fused together to maximize the overall brightness of the source.

In all of the above embodiments, various methods of attaching the diode bars to heat sinks can be incorporated. There are no restrictions whether to mount the bars horizontally or vertically. An eventual preference is only determined by packaging consideration. Also note that the individual optical elements may be formed separately and later joined by gluing, fusing, bonding, etc. to form a quasi-monolithic single optical element. Alternatively, individual optical elements may be machined or otherwise formed on or in a common monolithic substrate to form a single monolithic optical element. For purposes of the present description, the term "quasi-monolithic" includes both separate elements joined together and elements initially formed on a common, monolithic substrate.

In this disclosure there is shown and described only the preferred embodiments of the invention and but a few examples of its versatility. It is to be understood that the invention is capable of use in various other combinations and environments and is capable of changes or modifications within the scope of the inventive concept as expressed herein. Further, it should be noted and understood that all publications, patents and patent applications mentioned in this specification are indicative of the level of skill in the art to which the invention pertains. All publications, patents and patent applications are herein incorporated by reference to the same extent as if each individual publication, patent or patent application was specifically and individually indicated to be incorporated by reference in its entirety.

What is claimed is:

1. An optical element for beam shaping of an optical laser beam emission of a diode laser, said optical element comprising:
   a first element arranged for collimation of a fast axis of the laser beam emission; and
   a second element arranged for rotation of the laser beam emission by substantially ±90°, characterized in that both said first and second elements are optically bonded to each other constituting at least a quasi-monolithic single optical element.

2. The optical element according to claim 1, wherein both elements constitute a single monolithic element.

3. The optical element according to claim 1, wherein said second element constitutes an array of optical beam rotation elements, optically bonded to each other constituting at least a quasi-monolithic single optical element.

4. The optical element according to claim 3, wherein said second element constitutes a single monolithic array of optical beam rotation elements.

5. The optical element according to claim 1, further comprising a third element for collimation of a slow axis of the laser beam emission,
   characterized in that said third optical element is optically bonded to either side of said second element constituting at least a quasi-monolithic single optical element.

6. The optical element according to claim 5, wherein all three elements constitute a single monolithic element.

7. The optical element according to claim 5, wherein said third element constitutes a planar grin lens.

8. The optical element according to claim 5, wherein said third element constitutes a planar grin lens array.

9. The optical element according to claim 5, wherein said third element constitutes a surface curved in both or either of the directions orthogonal to the propagation direction.

10. The optical element according to claim 5, wherein said third element constitutes a multi-facet surface in both or either of the directions orthogonal to the propagation direction curved in both or either of the directions orthogonal to the propagation direction.

11. An optical element according to claim 5, further comprising cylindrical, spherical or aspherical lenses for coupling the diode beam into an optical fiber.

12. An optical element according to claim 1, further comprising cylindrical, spherical or aspherical lenses for coupling the diode beam into an optical fiber.

13. The optical element according to claim 1, further comprising a third element for collimation or expansion of the beam-rotated fast axis of the diode laser, characterized in that said third optical element is optically bonded to said second element constituting a quasi-monolithic single optical element.

14. The optical element according to claim 13, wherein said first, second and third elements constitute a single monolithic element.

15. The optical element according to claim 1, further comprising a third element for simultaneous (i) collimation of a slow axis of the laser beam emission and (ii) collimation of the laser beam emission after said rotation of said fast axis of the diode laser, characterized in that said third optical element is optically bonded to said second element constituting a quasi-monolithic single optical element.

16. The optical element according to claim 15, wherein said first, second and third elements constitute a single monolithic element.

17. The optical element according to claim 1, where said first element constitutes a planar grin lens.

18. The optical element according to claim 1, wherein said first element constitutes a uni-axial optical element with its optical axis aligned parallel to a slow axis of the diode laser axis, said first element further comprising a curved input surface and a flat output surface.

19. The optical element according to claim 1, wherein said second element constitutes a planar grin lens array.

20. The planar grin lens array according to claim 19, wherein a pitch of said planar grin lens array is equal to approximately 0.5.

21. The planar grin lens array according to claim 19, wherein planes of equal refractive index in said planar grin lens array are aligned at an angle of substantially ±45° with respect to a plane defined by a propagation direction of said laser beam emission and a slow axis of the diode laser.

22. The planar grin lens array according to claim 21, wherein a pitch of said planar grin lens array is equal to approximately 0.5.

23. An optical device comprising:

a plurality of optical elements for shaping a respective laser beam emission of a respective diode laser, each of said optical elements including (i) a first component element arranged for collimation of a fast axis of a respective laser beam emission and (ii) a second component element arranged for rotation of a respective laser beam emission by substantially ±90°;

respective pairs of said first and second component elements optically bonded to each other to form at least a quasi-monolithic single optical element;

said optical elements coupled into a multiple of optical fibers aligned in an optical fiber bundle so as to provide at least one combined beam of high optical power.

* * * * *